United States Patent
Corliss et al.

(10) Patent No.: US 10,274,836 B2
(45) Date of Patent: Apr. 30, 2019

(54) DETERMINATION OF LITHOGRAPHY EFFECTIVE DOSE UNIFORMITY

(71) Applicant: INTERNATIONAL BUSINESS MACHINES CORPORATION, Armonk, NY (US)

(72) Inventors: Daniel A. Corliss, Waterford, NY (US); Luciana Meli Thompson, Albany, NY (US); Christopher F. Robinson, Hyde Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 119 days.

(21) Appl. No.: 15/631,617

(22) Filed: Jun. 23, 2017

(65) Prior Publication Data
US 2018/0373164 A1    Dec. 27, 2018

(51) Int. Cl.
G06F 7/20 (2006.01)
G03F 7/20 (2006.01)

(52) U.S. Cl.
CPC ...... G03F 7/70625 (2013.01); G03F 7/70558 (2013.01)

(58) Field of Classification Search
CPC .................. G03F 7/70625; G03F 7/70558
USPC .......................................................... 430/30
See application file for complete search history.

(56) References Cited

U.S. PATENT DOCUMENTS

| | | | |
|---|---|---|---|
| 5,789,124 A | 8/1998 | Todd | |
| 6,021,009 A | 2/2000 | Borodovsky et al. | |
| 6,500,591 B1 | 12/2002 | Adams | |
| 6,943,882 B2 | 9/2005 | Renwick et al. | |
| 7,483,804 B2 | 1/2009 | Scheer | |
| 7,907,770 B2 | 3/2011 | Yang et al. | |
| 8,208,122 B2 | 6/2012 | Staals et al. | |
| 8,492,058 B2 | 7/2013 | Heo et al. | |
| 8,914,766 B2 | 12/2014 | Okamoto et al. | |
| 9,081,303 B2 | 7/2015 | Cramer et al. | |

OTHER PUBLICATIONS

Corliss et al., "Determination of Lithography Effective Dose Uniformity", U.S. Appl. No. 15/822,242, filed Nov. 27, 2017.
List of IBM Patents or Patent Applications Treated As Related; Date Filed: Nov. 27, 2017, 2 pages.
Barr, RL et al.; "Illumination Uniformity Measurement Technique Using Variable Exposure on a Wafer"; IP.com—PCOM000042001D; Feb. 3, 2005; 3 pages.
Gut, Gm et al.; "Mann 4800 Exposure Uniformity Test"; IP.com—IPCOM000061154D; Mar. 9, 2005; 2 pages.
Lin, BJ et al.; "E-Beam or Photoresist Films As Dose Uniformity Monitors of Ion Beams"; IP.com—IPCOM000053502D; Feb. 12, 2005; 2 pages.

*Primary Examiner* — Christopher G Young
(74) *Attorney, Agent, or Firm* — Cantor Colburn LLP; Vazken Alexanian

(57) ABSTRACT

Embodiments are directed to a method and system for determining effective dose of a lithography tool. The method includes performing a series of open frame exposures with the lithography tool on a substrate to produce a set of controlled exposure dose blocks in resist, and then baking and developing the exposed substrate. The method further includes scanning the resultant open frame images with oblique light and capturing the light scattered from the substrate surface. The method further includes creating a haze map from the background signal of the scattered light data, converting the haze map to a graphical image file, and analyzing the graphical image file to determine effective dose of the lithography tool, wherein a brightness of the graphical image file is related to effective dose of the lithography tool.

13 Claims, 7 Drawing Sheets

DETERMINATION OF LITHOGRAPHY EFFECTIVE DOSE UNIFORMITY

BACKGROUND

The present invention relates in general to the field of lithography. More specifically, embodiments of the present invention relate to the determination of the consistency and uniformity of lithography effective dose.

Lithography is a process used to transcribe a pattern, such as an integrated circuit pattern, or the like, onto a substrate. Lithography includes an exposure process in which a layer of resist (also known as photoresist) on a substrate is exposed to radiation that could be electrons, ions, soft x-ray (a.k.a. EUV) photons or optical photons modulated by a patterned mask. The photoresist is then developed to remove the exposed portion thereof (in the case of a positive photoresist) or non-exposed portion thereof (in the case of a negative photoresist), thereby forming a photoresist pattern. Then, a layer of material lying under the photoresist pattern is etched using the photoresist pattern as a mask. As a result, a pattern corresponding to the pattern of the mask is transcribed onto the substrate. The pattern can be used to create integrated circuit structures.

The dose and intensity of the exposure radiation should be controlled to be uniform during the exposure process. To this end, feedback relevant to the exposure radiation can be evaluated to determine the consistency and uniformity of the lithography process. In this respect, it becomes desirable to accurately characterize the exposure energy being delivered to the substrate. Control of the resist post-exposure bake and develop conditions are also important to ensure consistent dose response. It would be desirable to determine the repeatability and uniformity of the lithography process. In this respect, it becomes desirable to accurately characterize the effective dose delivered to the substrate, including the impacts of exposure dose and the post-exposure bake and develop processes.

SUMMARY

Embodiments of the present invention are directed to a method and system for determining the effective dose of a lithography tool. The method includes performing a series of open frame exposures with the lithography tool on a substrate to produce a set of controlled exposure dose blocks in resist. The method further includes baking and developing the exposed substrate. The method further includes scanning the resultant open frame images with oblique light and capturing the light scattered from the substrate surface. The method further includes creating a haze map from the background signal of the scattered light data, converting the haze map to a graphical image file, and analyzing the graphical image file to determine effective dose of the lithography tool. A brightness of the graphical image file is related to effective dose of the lithography tool.

Embodiments of the present invention are further directed to a system for determining effective dose of a lithography tool. The system includes a lithography tool arranged to perform a series of open frame exposures on a substrate to produce a set of controlled exposure dose blocks in resist and process tools to bake and develop the exposed substrate. The system is further arranged to include an inspection tool to scan the resultant open frame images with oblique light and capture the light scattered from the substrate surface. The system is further arranged to include software to create a haze map from the background signal of the scattered light data, convert the haze map to a graphical image file and perform off-line analysis to determine effective dose of the lithography tool from the graphical image file. A brightness of the graphical image file is related to effective dose of the lithography tool.

Embodiments of the present invention are further directed to a computer program product for determining effective dose of a lithography tool. The computer program product includes a computer-readable storage medium having program instructions embodied therewith. The program instructions are readable by a processor system to cause the processor to perform a series of open frame exposures with the lithography tool on a substrate to produce a set of controlled exposure dose blocks in resist, and then baking and developing the exposed substrate. The processor is further arranged to scan the resultant open frame images with oblique light and capture the light scattered from the substrate surface. The processor is further arranged to create a haze map from the background signal of the scattered light data, converting the haze map to a graphical image file, and analyzing the graphical image file to determine effective dose of the lithography tool. A brightness of the graphical image file is related to effective dose of the lithography tool Additional features and advantages are realized through techniques described herein. Other embodiments and aspects of the present invention are described in detail herein. For a better understanding, refer to the description and to the drawings.

BRIEF DESCRIPTION OF THE DRAWINGS

The subject matter which is regarded as embodiments of the present invention is particularly pointed out and distinctly claimed in the claims at the conclusion of the specification. The foregoing and other features and advantages of the embodiments of the present invention are apparent from the following detailed description taken in conjunction with the accompanying drawings in which:

Figure 1:
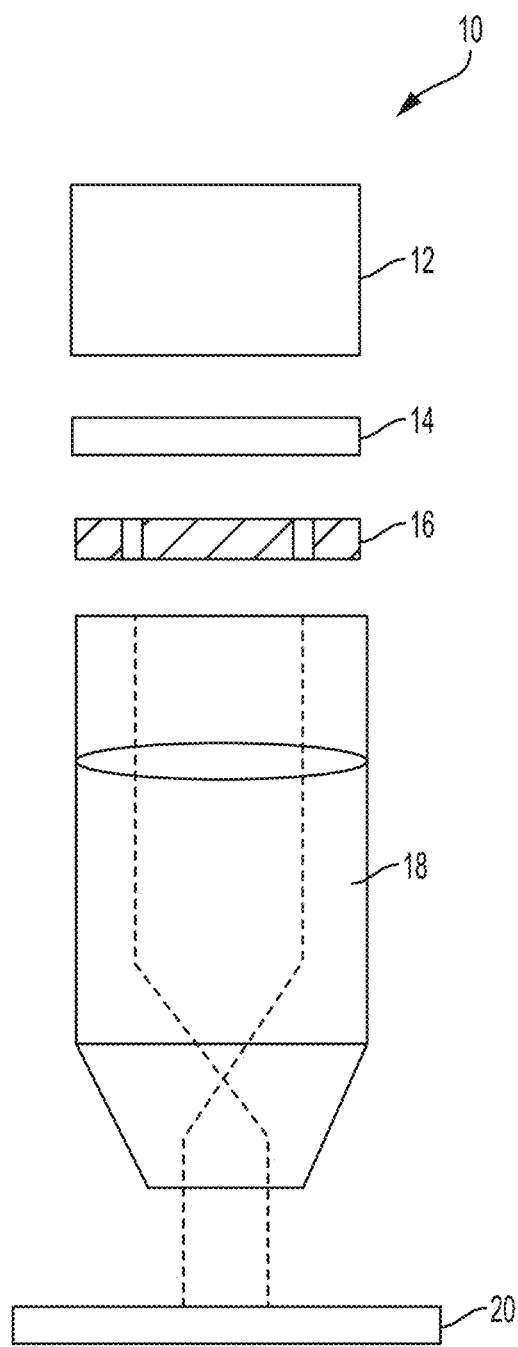
FIG. 1 is a pictorial representation of an exemplary scanner system.

The drawings are not necessarily to scale. The drawings, some of which are merely pictorial and schematic representations, are not intended to portray specific parameters of the invention. The drawings are intended to depict only typical embodiments of the invention, and therefore should not be considered as limiting. In the drawings, like numbering represents like elements.

DETAILED DESCRIPTION

Various embodiments of the present invention will now be described with reference to the related drawings. Alternate embodiments of the present invention may be devised without departing from the scope of the invention. Various connections might be set forth between elements in the following description and in the drawings. These connections, unless specified otherwise, may be direct or indirect, and the present description is not intended to be limiting in this respect. Accordingly, a coupling of entities may refer to either a direct or an indirect connection.

The terminology used herein is for the purpose of describing particular embodiments of the present invention only and is not intended to be limiting. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

In addition, it will be understood that when an element as a layer, region, or substrate is referred to as being "on" or "over", or "disposed on" another element, it can be directly on the other element or intervening elements may also be present. In contrast, when an element is referred to as being "directly on", "directly over", or "disposed proximately to" another element, there are no intervening elements present. It will also be understood that when an element is referred to as being "connected" or "coupled" to another element, it can be directly connected or directly coupled to the other element, or intervening elements may be present. In contrast, when an element is referred to as being "directly connected" or "directly coupled" to another element, there are no intervening elements present.

For the sake of brevity, conventional techniques related to semiconductor device and integrated circuit fabrication may not be described in detail herein. Moreover, the various tasks and process steps described herein may be incorporated into a more comprehensive procedure or process having additional steps or functionality not described in detail herein. In particular, various steps in the manufacture of semiconductor devices and semiconductor-based integrated circuits are well-known and so, in the interest of brevity, many conventional steps will only be mentioned briefly herein or will be omitted entirely without providing the well-known process details.

Turning now to an overview of technologies that are more relevant to aspects of the invention, a general description of the semiconductor device fabrication processes that may be utilized in implementing one or more embodiments of the present invention will now be provided. Although specific fabrication operations used in implementing one or more embodiments of the present invention may be individually known, the disclosed combination of operations and/or resulting structures are unique. Thus, the unique combination of the operations described in connection with the fabrication of semiconductor devices utilize a variety of individually known physical and chemical processes performed on a semiconductor (e.g., silicon) substrate, some of which are described in the following immediately following paragraphs.

In general, the various processes used to form a microchip that will be packaged into an integrated circuit fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., polysilicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions or even billions of transistors can be built and wired together to form the complex circuitry of a modern microelectronic device.

An important aspect to the above-described fabrication processes is semiconductor lithography, i.e., the formation of three-dimensional relief images or patterns on the semiconductor substrate for subsequent transfer of the pattern to the substrate. In semiconductor lithography, the patterns are placed on a radiation sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final semiconductor device.

Various types of exposure apparatuses can be used in lithography. For example, a scanner-type of exposure apparatus of a lithography system employs an exposure slit which defines the radiation contributing to the exposure process, and a setup in which the mask and a stage supporting the substrate are moved relative to each other so that the resist is scanned by the exposure radiation. In general, both the dose and intensity of the exposure radiation in the slit should be uniform if the exposure process is to be carried out effectively. Other exposure apparatuses also can be used. Likewise, it is important that the post-exposure bake and develop processes are consistent and uniform since these processes also influence the effective substrate dose.

A sensor integrated with the scanner-type of exposure apparatus may be used to measure the energy distribution of the exposure radiation. For extensive characterization, such a sensor may take tens of minutes to measure the energy distribution of radiation. The exposure system is not operated during this time. That is, there is down time in the exposure process, performed by a scanner-type of exposure apparatus, in which the exposure radiation is controlled based on measurements obtained using a sensor.

Examples of an alternative technique for quantifying the energy distribution of exposure radiation in a scanner-type of exposure apparatus (referred to simply as a "scanner" hereinafter), and a lithography method making use of such a technique, will now be described in detail with reference to the attached drawings.

Referring first to FIG. 1, an exemplary scanner 10 includes a condenser lens 12 for condensing radiation emitted from a radiation source (not illustrated), a mask 16 having pattern corresponding to a circuit pattern to be formed on a semiconductor substrate, a slit 14 defining the radiation condensed by the condenser lens 12 to a limited (desired) region of the mask 16, a projection lens system 18 for reducing the image of the radiation transmitted through the mask 16 and projecting the reduced image onto a substrate, and a wafer stage 20 provided under the projection lens system 18 for supporting the substrate. Scanner 10 may also be referred to as a stepper or a scanning stepper.

Figure 2:
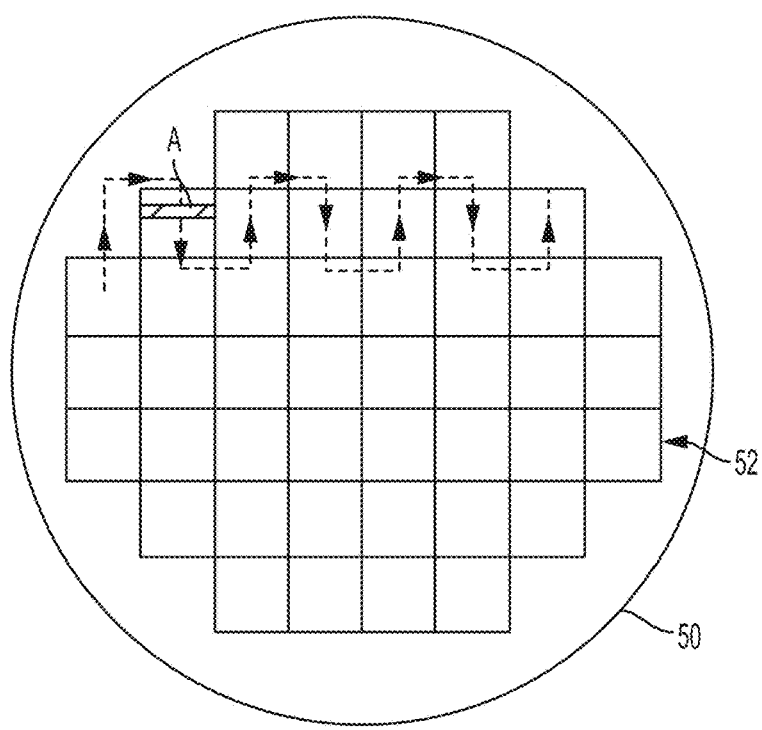
FIG. 2 is a pictorial representation of a substrate for use in an exemplary scanner system.

A method of exposing a substrate 20, using the scanner 10, will now be described with reference to both FIGS. 1 and 2. FIG. 2 is a pictorial representation of a substrate that is placed in an exemplary scanner system. Substrate 50 in FIG. 2 may be equivalent to substrate 20 of FIG. 1. The substrate 50 is divided into a plurality of regions 52 referred to as "fields" and the fields 52 of the substrate 50 are sequentially exposed by the exposure radiation. In each field 52, an area A (exposure slit) is projected on to the scanning substrate 50, the substrate 50 is moved relative to the exposure system 10 so that the exposure slit A is moved along the direction designated by the arrows in FIG. 2.

More specifically, in some embodiments of the present invention, the length of the exposure slit A has the same dimension as each field 52 in a given direction (the direction of the X-axis in FIG. 2). As the exposure slit A in a field is exposed, the substrate 50 is moved relative to the exposure system 10 in the width-wise direction of the exposure slit A, i.e., along the direction of the Y-axis continuously through the length of field 52 and the exposure process is then performed again with respect to the next exposure field 52. After each field 52 is exposed, the substrate 50 may be moved in the direction of the X-axis relative to the exposure system 10 to locate the exposure slit in the adjacent field 52, and then the adjacent field region is exposed as described above by moving the exposure slit A along the direction of the Y-axis. Thus, the substrate 50 is moved in one direction along the Y-axis while a first field 52 is exposed, and the substrate 50 may be moved in the other direction along the Y-axis (i.e., in the opposite direction) while the next field 52 is exposed.

In this manner, a resist layer formed over an entire region of the substrate 50 constituted by the fields 52 is exposed. Then, as mentioned above, the resist layer is developed to thereby form a resist pattern.

Referring back to FIG. 1 and FIG. 2, the exposure radiation defined by the slit 14 of the exposure system 10 exposes the layer of resist over each exposure field 52. The energy distribution of the exposure radiation along the slit 14, that is, at each location along the length of the slit 14, should be uniform if the resist pattern to be formed by the exposure process is to have uniform characteristics.

Figure 3A:
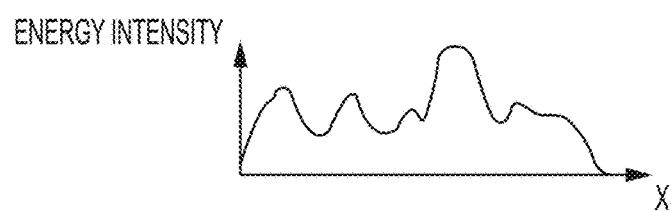
FIG. 3A is a graph illustrating a non-uniform energy distribution of exposure radiation of an exemplary system.
Figure 3B:
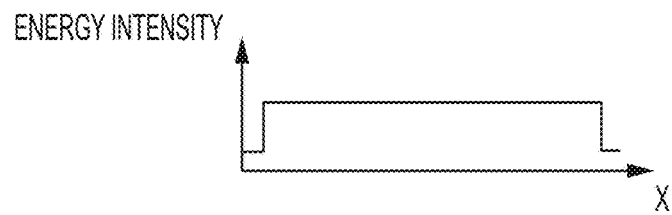
FIG. 3B is a graph illustrating a uniform energy distribution of exposure radiation of an exemplary system.

FIG. 3A show a non-uniform energy distribution of exposure radiation along the slit 14. In FIG. 3A, x-axis 310 represents the distance from the starting point, y-axis 320 represents the radiation intensity, and graph 330 is the graphical representation of radiation intensity at a particular point. On the other hand, FIG. 3B shows a uniform energy distribution along the slit 14. In FIG. 3B, x-axis 360 represents the distance from the starting point, y-axis 370 represents the radiation intensity, and graph 380 is the graphical representation of radiation intensity at a particular point. In the case in which the scanner 10 is producing exposure radiation having a non-uniform energy distribution as illustrated in FIG. 3A, the scanner 10 is adjusted or controlled such that the exposure radiation has a more uniform energy distribution closer to that illustrated in FIG. 3B. To this end, the distribution of the intensity of the exposure radiation passing through the slit 14 is measured along the length of the slit 14.

According to an aspect of the inventive concept, relationships between the intensity of the exposure radiation, the oblique light scattered from the residual resist in the open frame exposure blocks after the developing process, and color characteristics of the haze map graphical image pixels, are determined and then are subsequently used to determine or "measure" the distribution of the intensity of the exposure radiation defining the slit 14. These relationships as conceived by the present inventors will first be described in more detail.

When a layer of a positive photoresist (referred to simply as a "photoresist layer" hereinafter) is exposed using a scanner-type of exposure apparatus, the exposed portion of the photoresist layer undergoes a reaction which makes the exposed portion more soluble in a developing solution. In some cases, the exposure is followed by a bake process to accelerate the exposure reaction. Thus, the exposed portion of the photoresist layer may be selectively removed by performing a developing process in which the exposed photoresist layer is wetted by the developing solution. In this respect, the degree of dissolution depends on the dosage (level of energy) of the exposure radiation. Furthermore, when a layer of photoresist is developed, the thickness of a layer of exposed photoresist decreases. If the delivered radiation dose is less than that required for full dissolution, the residual thickness, roughness and other surface properties depend on the dosage of the exposure radiation.

More specifically, resist dissolution does not occur when the intensity of the exposure radiation has a relatively low value. In this case, the thickness of the photoresist layer is hardly affected by the developing process. On the other hand, dissolution occurs throughout the thickness of the layer of photoresist when the intensity of the exposure radiation has a certain value, E0, known as the dose-to-clear. E0 dosage results in full dissolution and removal of the photoresist film. For radiation doses above and beyond E0, the resist is also removed, though the haze map detects evidence of surface energy changes that could be due to interactions with the substrate. The net result is that residual film properties at exposure doses slightly off the E0 dose can provide a very sensitive metric of radiation dose variations.

A common method of testing lithography systems is the use of a scanning electron microscope (SEM) to measure the feature size of developed critical dimension (CD) images. An alternative characterization practice, employed open frame exposures (exposures without a mask pattern) performed on a wafer. The developed open frame images were evaluated qualitatively via optical microscopy or quantitatively by sampling residual resist thicknesses. There are a variety of shortcomings of such methodologies. CD SEM measurements can be limited by feature sampling density and measurement throughput, and are affected by non-dose related factors such as image defocus. In addition, optical microscopic evaluation of open frame exposures is subjective and does not provide enough sensitivity. Film thickness metrology of open frame exposures provides more objective results, but the spatial frequency of the data collected is limited by the discrete nature of the sampling and the low throughput of the measurements.

Turning now to an overview of the aspects of the invention, one or more embodiments of the invention address the above-described shortcomings of the prior art by providing a quick and accurate method and system of analyzing dose aspects of the lithography. The shortcomings of the prior art are overcome by graphically analyzing oblique light scattered during a surface scan of a wafer with open frame images. This technique provides high sensitivity, while allowing an analysis of a large area of the wafer. An analysis of high-spatial frequency surface inspection haze data derived from the scattered light background "noise" signal can turn the open frame test into a very powerful quantitative dose assessment technique.

Figure 4:
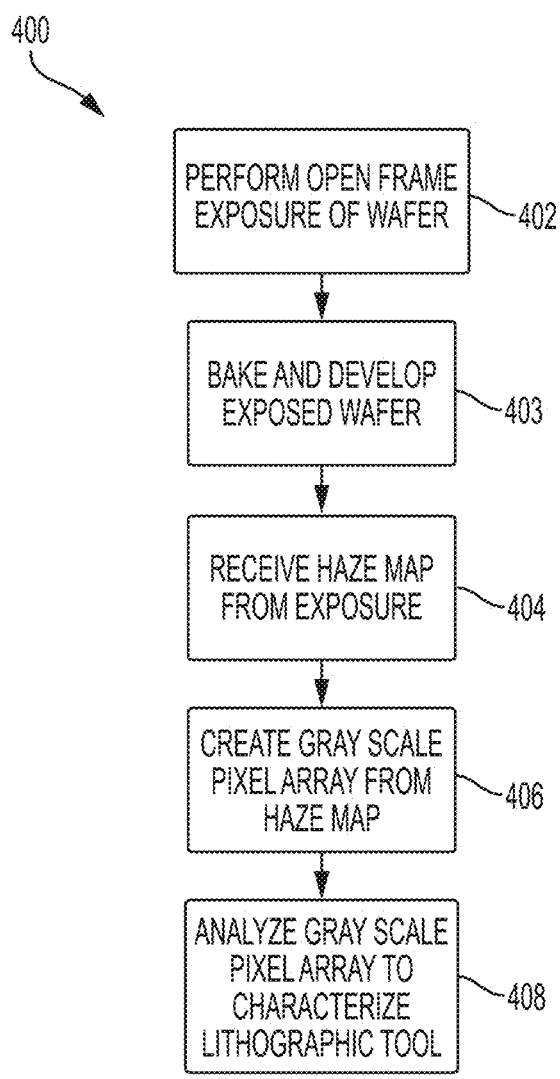
FIG. 4 is flow diagram illustrating a method for characterizing an exemplary scanner system according to one or more embodiments of the invention.

Turning now to a more detailed description of aspects of the present invention, a flowchart illustrating method 400 is presented in FIG. 4. Method 400 is merely exemplary and is not limited to the embodiments of the present invention presented herein. Method 400 can be employed in many different embodiments or examples of the present invention not specifically depicted or described herein. In some embodiments, the procedures, processes, and/or activities of method 400 can be performed in the order presented. In other embodiments of the present invention, one or more of the procedures, processes, and/or activities of method 400 can be combined or skipped. In one or more embodiments of the present invention, method 400 is performed by a processor as it is executing instructions and controlling an exemplary scanner.

An open frame exposure is performed on a wafer or substrate (block 402). The open frame wafer exposure is a traditional exposure done in a manner now known or developed in the future. A layer of photoresist may be placed on the wafer prior to the open frame wafer exposure. No mask pattern is used when making the open frame wafer exposure.

The full wafer exposure can produce a set of dose dependent graded thickness blocks after resist post-exposure bake and develop steps (block 403). The wafer can be divided into multiple fields, row, or columns, as described in further detail below. The developed images are scanned in a defect inspection tool that detects oblique light scattered from the substrate surface. The signal background levels or the noise detected during the defect inspection of the processed open frame wafer is sometimes referred to as a haze data. The "haze map" (block 404) collects this noise data from a surface scan of the entirety of the wafer.

The haze map is converted to a grayscale pixel array (block 406). This can be performed in one of a variety of different manners. In some embodiments of the present invention, the gray scale pixel array can be output directly by the defect inspection tool. In some embodiments of the present invention, a high-resolution graphical image file of the wafer is output which contains the gray scale pixel details. In some embodiments of the present invention, multiple high-resolution images of the wafer are output by the defect inspection tool. In some embodiments of the present invention, the images are grayscale images.

In the image(s), the surface characteristics of a particular field (such as field 52) are represented in the pixel array as shades of gray. The brightness of the image at a point is related to the residual resist film properties (e.g. thickness, roughness, surface energy) at that point and thus is related to the energy received at that point. In an 8-bit example, the grayscale can range from 255 (representing E0, a dose sufficient for full removal by the development process) to 0 (representing a dose significantly more or less than E0). It should be understood that other bit depths can be used. For example, 10-bit graphics files could be used where 1024 different levels of gray can be determined. Other types of graphical files can be created. It should also be understood that color images can be created instead of grayscale images. In such a manner, the haze map is quickly transformed from into a graphical image that can then be analyzed using any one of a number of different graphic tools.

The pixel array can then be analyzed using one of a variety of different techniques (block 408). Because the array is now a graphic file in one of a variety of different formats (for example, jpeg, png, gif, bmp, tiff, and the like), a variety of different manners can be used to perform an analysis of the graphic file. For example, analysis software such as MATLAB can be used to analyze the uniformity of the graphic file. The analysis can translate the graphic file into multiple two-dimensional graphs. Thereafter, the scanner energy consistency and uniformity within a field can be characterized. This enables better understanding of the scanner performance limitations and can be used to verify scanner optimization strategies.

Figure 6A:
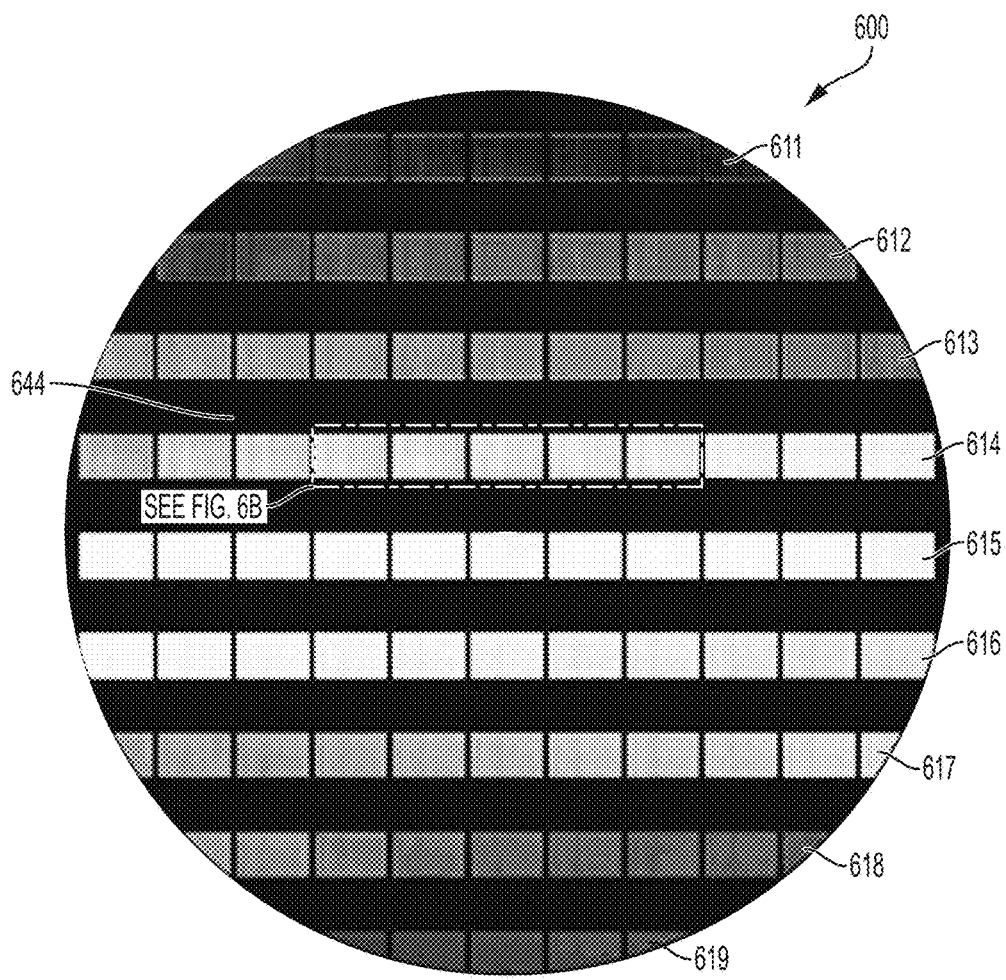
FIG. 6A is an exemplary graphic image file created by one or more embodiments of the present invention.

FIG. 6A illustrates an exemplary graphic file created from a haze map of a lithographic wafer populated with an array of open frame exposures. The exemplary wafer 620 has 9 rows of fields. The rows are labeled 611 through 619. As can be seen, in this embodiment of the present invention, each field has a different level of exposure. Any methodology can be used to create a different level of exposure for each field, row of fields or column of fields. In FIG. 6A, fields in row 611 received the least effective dose, resulting in a darker haze map images. Fields in higher rows received greater effective dose. The resist clearing dose is achieved in row 615, resulting in very bright images. Even higher doses result in darker haze map images due to additional surface interactions, that is, how the surface scatters the incident oblique light. Thus, the brightness of the graphical image file is related to the effective dose of the lithography tool.

Of particular interest in this exemplary analysis are the fields that receive a bit more or less than the resist clearing effective dose, such as row 614. The intermediate gray levels exhibited in row 614 (highlighted in box 644) lead to heightened analysis sensitivity. This is shown in more detail in FIG. 6B where one can see vertical bright stripes corresponding to in slit dose variations. It should be understood that the analyses can be performed on various fields with the same, or a range of effective doses to characterize wafer to wafer, field to field or within field effective dose variations. In addition, the identification of the clearing dose, E0, within the exposure array is itself a powerful tool for quantifying the wafer to wafer scanner dose repeatability.

Figure 5A:
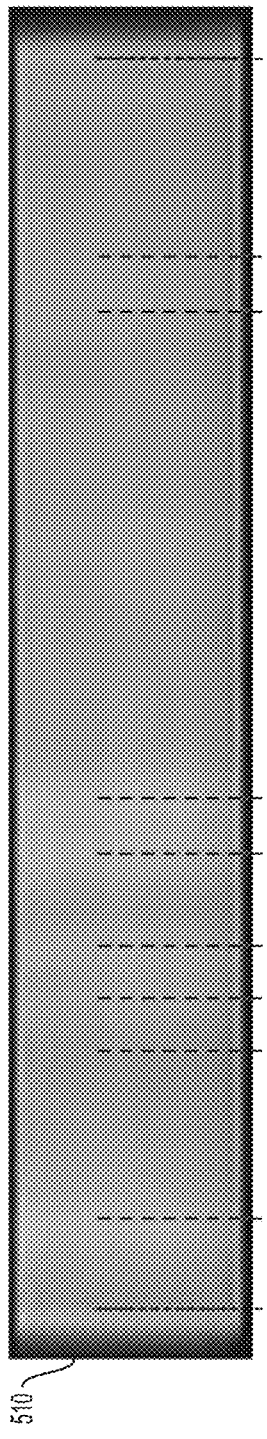
FIG. 5A is a portion of an exemplary graphic image file created by one or more embodiments of the present invention.
Figure 6B:
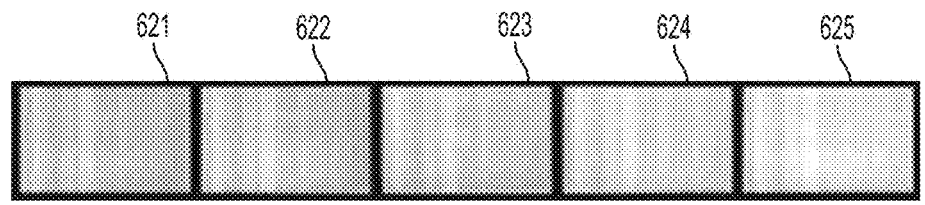
FIG. 6B presents a portion of the exemplary graphic image file in greater detail.

FIG. 6B is an expanded view of five adjacent fields of row 614. The fields are labeled 621 through 625. A close analysis of each field can reveal that, instead of the field being a uniform level of gray, there can be areas of the field that are darker or lighter than adjacent areas. As described earlier, darker or lighter areas are indicative of areas that received a lesser or greater amount of exposure energy. Each of the fields can be examined in further detail by zooming in to reveal greater detail. This is shown in FIG. 5A, which is an expanded view of field 624.

In theory, FIG. 5A should be uniform. However, it can be seen that FIG. 5A is not uniform. Instead, there are a variety of shades of gray present in FIG. 5A. By analyzing the graphic image file, the shades of gray can be converted to the amount of scanner dose delivered at that particular point.

FIG. 5A illustrates an exemplary graphic file 510 that was created using field 624. With respect to FIG. 5B, graph 520 is a left to right scan for the average of all vertical locations in graphic file 510. One could also plot this across slit profile at a particular vertical location of graphic file 510. The X-axis 522 of graph 520 illustrates the distance along the exposure slit from a chosen zero point. The chosen zero point in graph 520 is at the left end of graphic file 510. The Y-axis 524 illustrates the gray level at that particular point. As explained above, in an 8-bit graphic file, there can be 256 shades of gray that represent different effective doses. The gray level in the file for a particular slit location is related to the amount of energy received at that location. It can be seen that graph 520 tracks the haze map 510, with lighter areas of haze map 510 relating to lower points of graph 520. A lower point of graph 520 indicates that a lower amount of energy reached the photoresist at that point.

Figure 5B:
FIG. 5B is an analysis of the exemplary graphic file created by one or more embodiments of the present invention.
Figure 5C:
FIG. 5C is a graph illustrating an intensity profile created by a scanner on-board calibration.

With respect to FIG. 5C, a scanner calibration result 530 of the scanner at issue is illustrated. Calibration 530 was created using scanner on-board metrology. Some scanners used for lithography have on-board tools that can analyze and create an energy profile. The X-axis 532 represents the distance along the exposure slit from the chosen zero point and the Y-axis 534 represents the intensity. Graph 530 thus represents the radiation intensity across the exposure slit. By matching graph 530 with graph 520, it can be seen that graph 520 created from the graphic image file using one or more embodiments of the present invention corresponds well with the scanner's own calibrated intensity profile. In particular, localized low-points of graph 520 mostly correspond to low-points of graph 530 and localized high-points of graph 520 mostly correspond to high-points of graph 530. However, on-board metrology takes a period of dedicated scanner time to sample a reduced array of exposure slit locations sequentially unlike the normal exposure sequence where the full slit is imaged concurrently. Extensive measurements could take the scanner out of production for a significant portion of an hour. In contrast, embodiments of the present invention using open-frame exposures characterize the exposure uniformity under normal exposure conditions. After just minutes for test wafer exposures, the scanner can resume production while an analysis using one or more embodiments of the present invention is performed.

Figure 5D:
FIG. 5D is a graph illustrating an intensity analysis performed by measuring exposed images from the scanner on a scanning electron microscope.

With respect to FIG. 5D, a scanning electron microscope (SEM) was used to measure the width of lines between developed trenches in resist on a silicon wafer that were exposed on a lithography scanner. Graph 540 includes an X-axis 542 representing distance along the exposure slit from a chosen zero point. Y-axis 544 is the measurement of the line critical dimension (CD) based on the SEM analysis. Graph 540 thus represents the critical dimension measurement across the exposure slit. It can be seen that the critical dimension measurements of the wafer in graph 540 correspond well with graph 530 of FIG. 5C and graph 520 of FIG. 5B. As expected, locations receiving a higher effective dose have reduced line width and locations receiving a lower effective dose have increased line widths.

However, the CD SEM profile created in FIG. 5D is much more time consuming to generate than the on-board metrology process of FIG. 5C and the graphic image file of FIG. 5B, created using embodiments of the present invention. Thus, there is a lesser tendency to generate slit profiles on a CD SEM. In contrast, the file created in FIG. 5B can be created very quickly (on the order of five minutes for a full wafer that includes 100 fields) in contrast to the hours-long process of completing the necessary measurements on a CD SEM.

In addition, embodiments of the present invention can have much finer sampling than SEM methods. CD SEM sampling is limited by the placement of appropriate measurement features. In many current CD SEM methods, 65 samples per exposure field represents a "dense" sampling. In contrast, embodiments of the present invention are only limited by the resolution of the device used to capture the haze map and generate the graphic image file. In some embodiments of the present invention, 20,000-80,000 pixels can be present in a particular exposure field, a resolution that is 300-1200 times finer than CD SEM methods. A further advantage, is that embodiments of the present invention are not affected by non-dose related effects such as image defocus.

Figure 7:
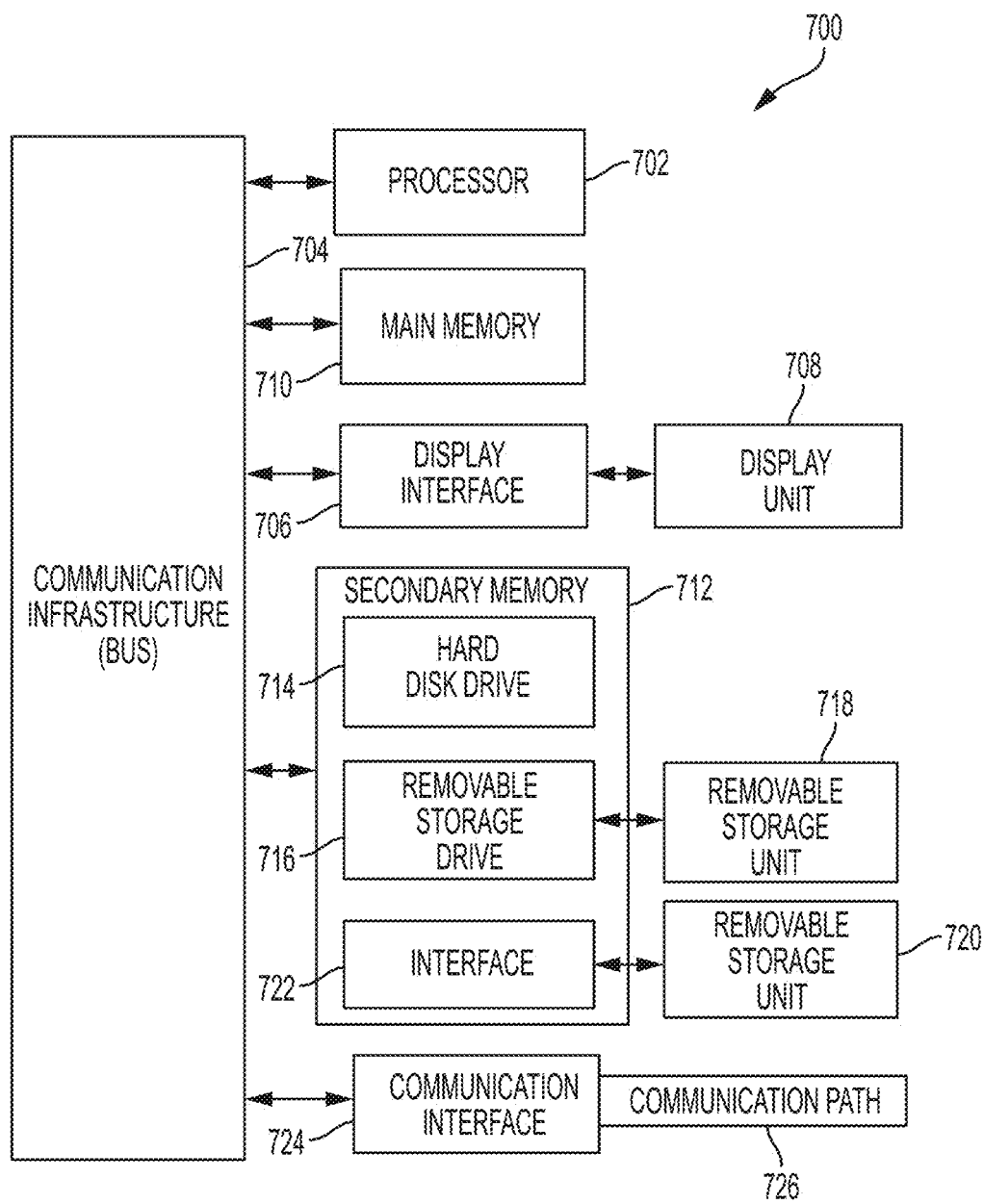
FIG. 7 is a block diagram of a computer system capable of performing one or more embodiments of the present invention.

FIG. 7 depicts a high-level block diagram of a computer system 700, which can be used to implement all or part of one or more embodiments of the present invention. More specifically, computer system 700 can be used to implement hardware components of systems capable of performing methods described herein. For example, computer system 700 can be used to control a scanner or other lithography tool. Computer system 700 can be used to perform analysis of a graphical image file created using one or more embodiments of the present invention. Although one exemplary computer system 700 is shown, computer system 700 includes a communication path 726, which connects computer system 700 to additional systems (not depicted) and can include one or more wide area networks (WANs) and/or local area networks (LANs) such as the Internet, intranet(s), and/or wireless communication network(s). Computer system 700 and additional system are in communication via communication path 726, e.g., to communicate data between them. Computer system 700 can have one of a variety of different form factors, such as a desktop computer, a laptop computer, a tablet, an e-reader, a smartphone, a personal digital assistant (PDA), and the like.

Computer system 700 includes one or more processors, such as processor 702. Processor 702 is connected to a communication infrastructure 704 (e.g., a communications bus, cross-over bar, or network). Computer system 700 can include a display interface 706 that forwards graphics, textual content, and other data from communication infrastructure 704 (or from a frame buffer not shown) for display on a display unit 708. Computer system 700 also includes a main memory 710, preferably random access memory (RAM), and can include a secondary memory 712. Secondary memory 712 can include, for example, a hard disk drive 714 and/or a removable storage drive 716, representing, for example, a floppy disk drive, a magnetic tape drive, or an optical disc drive. Hard disk drive 714 can be in the form of a solid state drive (SSD), a traditional magnetic disk drive, or a hybrid of the two. There also can be more than one hard disk drive 714 contained within secondary memory 712. Removable storage drive 716 reads from and/or writes to a removable storage unit 718 in a manner well known to those having ordinary skill in the art. Removable storage unit 718 represents, for example, a floppy disk, a compact disc, a magnetic tape, or an optical disc, etc. which is read by and written to by removable storage drive 716. As will be appreciated, removable storage unit 718 includes a computer-readable medium having stored therein computer software and/or data.

In alternative embodiments of the present invention, secondary memory 712 can include other similar means for allowing computer programs or other instructions to be loaded into the computer system. Such means can include, for example, a removable storage unit 720 and an interface 722. Examples of such means can include a program package and package interface (such as that found in video game devices), a removable memory chip (such as an EPROM, secure digital card (SD card), compact flash card (CF card), universal serial bus (USB) memory, or PROM) and associated socket, and other removable storage units 720 and interfaces 722 which allow software and data to be transferred from the removable storage unit 720 to computer system 700.

Computer system 700 can also include a communications interface 724. Communications interface 724 allows software and data to be transferred between the computer system and external devices. Examples of communications interface 724 can include a modem, a network interface (such as an Ethernet card), a communications port, or a PC card slot and card, a universal serial bus port (USB), and the like. Software and data transferred via communications interface 724 are in the form of signals that can be, for example, electronic, electromagnetic, optical, or other signals capable of being received by communications interface 724. These signals are provided to communications interface 724 via communication path (i.e., channel) 726. Communication path 726 carries signals and can be implemented using wire or cable, fiber optics, a phone line, a cellular phone link, an RF link, and/or other communications channels.

In the present description, the terms "computer program medium," "computer usable medium," and "computer-readable medium" are used to refer to media such as main memory 710 and secondary memory 712, removable storage drive 716, and a hard disk installed in hard disk drive 714. Computer programs (also called computer control logic) are stored in main memory 710 and/or secondary memory 712. Computer programs also can be received via communications interface 724. Such computer programs, when run, enable the computer system to perform the features discussed herein. In particular, the computer programs, when run, enable processor 702 to perform the features of the computer system. Accordingly, such computer programs represent controllers of the computer system. Thus it can be seen from the forgoing detailed description that one or more embodiments of the present invention provide technical benefits and advantages.

Figure 8:
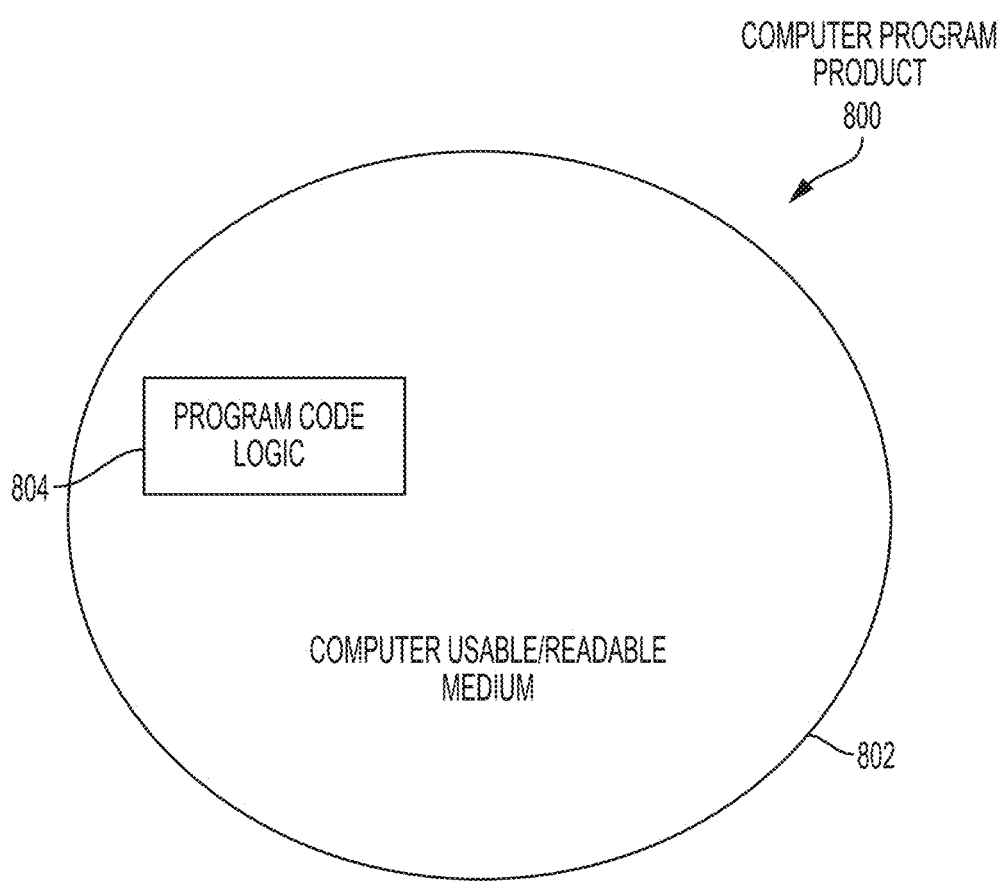
FIG. 8 is a block diagram of a computer program product capable of performing one or more embodiments of the present invention.

Referring now to FIG. 8, a computer program product 800 in accordance with one or more embodiments of the present invention that include a computer-readable storage medium 802 and program instructions 804 is generally shown.

Embodiments of the present invention can be a system, a method, and/or a computer program product. The computer program product can include a computer-readable storage medium (or media) having computer-readable program instructions thereon for causing a processor to carry out aspects of embodiments of the present invention.

The computer-readable storage medium can be a tangible device that can retain and store instructions for use by an instruction execution device. The computer-readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer-readable program instructions described herein can be downloaded to respective computing/processing devices from a computer-readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers, and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out embodiments of the present invention can include assembler instructions, instruction-set-architecture (ISA) instructions, machine instructions, machine dependent instructions, microcode, firmware instructions, state-setting data, or either source code or object code written in any combination of one or more programming languages, including an object-oriented programming language such as Smalltalk, C++ or the like, and conventional procedural programming languages, such as the "C" programming language or similar programming languages. The computer-readable program instructions can execute entirely on the consumer's computer, partly on the consumer's computer, as a stand-alone software package, partly on the consumer's computer and partly on a remote computer or entirely on the remote computer or server. In the latter scenario, the remote computer can be connected to the consumer's computer through any type of network, including a local area network (LAN) or a wide area network (WAN), or the connection can be made to an external computer (for example, through the Internet using an Internet Service Provider). In some embodiments of the present invention, electronic circuitry including, for example, programmable logic circuitry, field-programmable gate arrays (FPGA), or programmable logic arrays (PLA) can execute the computer-readable program instructions by utilizing state information of the computer-readable program instructions to personalize the electronic circuitry, in order to perform embodiments of the present invention.

Aspects of various embodiments of the present invention are described herein with reference to flowchart illustrations and/or block diagrams of methods, apparatus (systems), and computer program products according to various embodiments of the present invention. It will be understood that each block of the flowchart illustrations and/or block diagrams, and combinations of blocks in the flowchart illustrations and/or block diagrams, can be implemented by computer-readable program instructions.

These computer-readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions can also be stored in a computer-readable storage medium that can direct a computer, a programmable data processing apparatus, and/or other devices to function in a particular manner, such that the computer-readable storage medium having instructions stored therein includes an article of manufacture including instructions which implement aspects of the function/act specified in the flowchart and/or block diagram block or blocks.

The computer-readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments of the present invention only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description has been presented for purposes of illustration and description, but is not intended to be exhaustive or limited to the form disclosed. Many modifications and variations will be apparent to those of ordinary skill in the art without departing from the scope and spirit. The embodiments of the present invention described herein were chosen and described in order to best explain the principles of embodiments of the invention and the practical application, and to enable others of ordinary skill in the art to understand the various embodiments of the present invention with various modifications as are suited to the particular use contemplated.

What is claimed is:

1. A system for determining effective dose of a lithography tool comprising:
   a lithography tool arranged to perform a series of open frame exposures on a substrate to produce a set of controlled exposure dose blocks in resist;
   process tools to bake and develop the exposed substrate;
   an inspection tool to scan the resultant open frame images with oblique light and capture the light scattered from the substrate surface;
   software to create a haze map from the background signal of the scattered light data and convert the haze map to a graphical image file; and
   off-line analysis to determine effective dose of the lithography tool from the graphical image file, wherein a brightness of the graphical image file is related to effective dose of the lithography tool.

2. The system of claim 1 wherein performing the open frame exposure comprises:
   depositing photoresist on the substrate; and
   performing a pattern-less exposure of the substrate.

3. The system of claim 2 wherein performing a pattern-less exposure comprises:
   dividing the substrate into a plurality of fields, rows, or columns; and
   providing each field, row, or column of the substrate with a different amount of effective dose.

4. The system of claim 1 wherein the analysis of the graphic image file comprises:
   determining a brightness of the image file for a plurality of points of the graphic image file; and
   using the brightness to determine energy output of the lithography tools.

5. The system of claim 4 wherein the system is further arranged to:
   use the energy output determination to characterize the wafer to wafer dose consistency of the lithography tool.

6. The system of claim 4 wherein the system is further arranged to:
   use the energy output determination to characterize the within field dose uniformity of the lithography tool.

7. The system of claim 1 wherein generating the haze map graphical image file comprises:
   scanning the resultant open frame images with oblique light and capturing the light scattered from the substrate surface using an oblique light inspection device;
   creating a haze map from the background signal of the scattered light data;
   converting the haze map to a graphical image file.

8. The system of claim 7 wherein the oblique light inspection device is a defect inspection tool.

9. A computer program product for determining effective dose of a lithography tool comprising:

a computer-readable storage medium having program instructions embodied therewith, the program instructions readable by a processor system to cause the processor system to:
  perform a series of open frame exposures with the lithography tool on a substrate to produce a set of controlled exposure dose blocks in resist;
  bake and develop the exposed substrate;
  scan the resultant open frame images with oblique light and capture the light scattered from the substrate surface, using an oblique light inspection device;
  create a haze map from the background signal of the scattered light data;
  convert the haze map to a graphical image file; and
  analyze the graphical image file to determine effective dose of the lithography tool, wherein a brightness of the graphical image file is related to effective dose of the lithography tool.

10. The computer program product of claim 9 wherein performing the open frame exposure comprises:
  depositing photoresist on the substrate; and
  performing a pattern-less exposure of the substrate.

11. The computer program product of claim 10 wherein performing a pattern-less exposure comprises:
  dividing the substrate into a plurality of fields, rows or columns; and
  providing each field, row or column of the substrate with a different amount of exposure dose.

12. The computer program product of claim 9 wherein analyzing the graphic image file comprises:
  determining a brightness of the image file for a plurality of points of the graphic image file; and
  using the brightness determination to determine energy output of the lithography tools.

13. The computer program product of claim 12 wherein the system is further arranged to:
  use the energy output determination to characterize the wafer to wafer dose consistency of the lithography tool.

* * * * *